United States Patent
Tian (10) Patent No.: US 11,249,141 B2
(45) Date of Patent: Feb. 15, 2022

(54) APPARATUS AND METHOD FOR TESTING ADAPTOR

(71) Applicant: GUANGDONG OPPO MOBILE TELECOMMUNICATIONS CORP., LTD., Guangdong (CN)

(72) Inventor: Chen Tian, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 161 days.

(21) Appl. No.: 16/701,957

(22) Filed: Dec. 3, 2019

(65) Prior Publication Data

US 2020/0103471 A1    Apr. 2, 2020

Related U.S. Application Data

(63) Continuation of application No. PCT/CN2018/108608, filed on Sep. 29, 2018.

(51) Int. Cl.
*G01R 31/40* (2020.01)
(52) U.S. Cl.
CPC .................... *G01R 31/40* (2013.01)
(58) Field of Classification Search
CPC .. G01R 31/40; G01R 31/2848; G01R 31/367; G01R 31/382

(Continued)

(56) References Cited

U.S. PATENT DOCUMENTS 5,821,755 A   10/1998  Henze
7,403,021 B2 *  7/2008  Tan .................. G01R 31/31715
324/538

(Continued)

FOREIGN PATENT DOCUMENTS

CN       101865958       10/2010
CN       102411128        4/2012

(Continued)

OTHER PUBLICATIONS

IPI, Office Action for IN Application No. 201917050270, dated Feb. 10, 2021.

(Continued)

*Primary Examiner* — Giovanni Astacio-Oquendo
(74) *Attorney, Agent, or Firm* — Hodgson Russ LLP (57) ABSTRACT

Provided are an apparatus for testing an adaptor, a method for testing an adaptor, and a computer storage medium. The apparatus includes a testing module, a host computer, and an electronic load. The testing module is coupled with the electronic load to simulate a working state of an electronic device, to acquire a simulated battery voltage value corresponding to the working state. The testing module is configured to be coupled with an adaptor to-be-tested to control, according to the simulated battery voltage value, the adaptor to-be-tested to be in a target output state. The testing module is coupled with the host computer, to detect the target output state of the adaptor to-be-tested to obtain output information of the adaptor to-be-tested and send the output information to the host computer. The host computer is configured to output a test result of the adaptor to-be-tested according to the output information of the adaptor to-be-tested.

19 Claims, 3 Drawing Sheets

(58) Field of Classification Search
USPC .................................. 324/764.01, 537, 500
See application file for complete search history.

(56) References Cited

U.S. PATENT DOCUMENTS

| | | | | |
|---|---|---|---|---|
| 8,233,974 | B2* | 7/2012 | Ward ................... | A61B 5/0537 600/547 |
| 8,930,729 | B1* | 1/2015 | Fifield ...................... | G06F 1/26 713/310 |
| 2006/0259290 | A1 | 11/2006 | Steffen | |
| 2008/0197831 | A1 | 8/2008 | Kokubun et al. | |
| 2008/0303542 | A1* | 12/2008 | Wang ................. | G01R 31/2884 324/762.03 |
| 2010/0060303 | A1* | 3/2010 | Beckmann ........... | G01R 31/006 324/750.01 |
| 2012/0022811 | A1* | 1/2012 | Dickinson ............. | B60L 53/305 702/60 |
| 2013/0346025 | A1 | 12/2013 | Schulz | |
| 2020/0136410 | A1* | 4/2020 | Tian ................. | G01R 19/16528 |

FOREIGN PATENT DOCUMENTS

| | | |
|---|---|---|
| CN | 102539947 | 7/2012 |
| CN | 202583381 | 12/2012 |
| CN | 203981802 U | 12/2014 |
| CN | 104635176 | 5/2015 |
| CN | 106291179 | 1/2017 |
| CN | 106443286 A | 2/2017 |
| CN | 106597303 | 4/2017 |
| CN | 106841708 | 6/2017 |
| CN | 107817393 | 3/2018 |
| CN | 207352137 U | 5/2018 |
| CN | 108123519 | 6/2018 |
| JP | H0833188 | 2/1996 |
| TW | I625533 B | 6/2018 |

OTHER PUBLICATIONS

EESR issued in corresponding European application No. 18934525.9 dated Oct. 2, 2020.
ISR issued in corresponding international application No. PCT/CN2018/108608 dated Jun. 27, 2019.
CNIPA, First Office Action for CN Application No. 201880031868.4, dated Sep. 23, 2021.
JPO, Office Action for JP Application No. 2021-500172, dated Dec. 17, 2021.

* cited by examiner

APPARATUS AND METHOD FOR TESTING ADAPTOR

CROSS-REFERENCE TO RELATED APPLICATION

This application is a continuation of International Application No. PCT/CN2018/108608, filed on Sep. 29, 2018, the entire disclosure of which is incorporated herein by reference.

TECHNICAL FIELD

This disclosure relates to the field of testing technology, and more particularly to an apparatus for testing an adaptor and a method for testing an adaptor.

BACKGROUND

With a wider variety of electrical equipment, power adaptors have been used in all kinds of domains. In order to ensure the quality of the power adaptor, the power adaptor usually needs to be tested.

Currently, testing is performed on a single power adaptor, and such testing is not comprehensive enough. However, if a mobile phone is used as a real workload for test, it is necessary to set a proper test environment, which is inconvenient; on the other hand, a short-circuit test will easily cause mobile phone explosion, which puts testers at risk.

SUMMARY

In a first aspect, an apparatus for testing an adaptor is provided. The apparatus includes a testing module, a host computer, and an electronic load. The testing module is coupled with the electronic load to simulate a working state of an electronic device, to acquire a simulated battery voltage value corresponding to the working state. The testing module is configured to be coupled with an adaptor to-be-tested to control, according to the simulated battery voltage value, the adaptor to-be-tested to be in a target output state. The testing module is coupled with the host computer, to detect the target output state of the adaptor to-be-tested to obtain output information of the adaptor to-be-tested and send the output information to the host computer. The host computer is configured to output a test result of the adaptor to-be-tested according to the output information of the adaptor to-be-tested.

In a second aspect, a testing board is provided. The testing board includes at least a metal-oxide-semiconductor field-effect transistor (MOSFET) component and a microcontroller unit (MCU) component. The testing board, along with an electronic load, is configured to simulate a working state of an electronic device to test an adaptor to-be-tested.

In a third aspect, a system for testing an adaptor is provided. The system includes an adaptor to-be-tested and the apparatus for testing an adaptor described in the first aspect. The apparatus for testing an adaptor is configured to test the adaptor to-be-tested.

In a fourth aspect, a method for testing an adaptor is provided. The method is applicable to an apparatus for testing an adaptor. The apparatus includes a testing module, an electronic load, and a host computer. The method includes the following. A working state of an electronic device is simulated with the testing module and the electronic load, to acquire a simulated battery voltage value corresponding to the working state. An adaptor to-be-tested is controlled to be in a target output state according to the simulated battery voltage value. The target output state of the adaptor to-be-tested is detected to obtain output information of the adaptor to-be-tested. A test result of the adaptor to-be-tested is outputted according to the output information of the adaptor to-be-tested.

In a fifth aspect, an apparatus for testing an adaptor is provided. The apparatus includes a testing module, an electronic load, and a host computer, where the testing module is integrated with a first processor and a first memory configured to store computer programs operable with the first processor, the host computer is integrated with a second processor and a second memory configured to store computer programs operable with the second processor, and the computer programs stored in the first memory and the computer programs stored in the second memory, when executed, are operable with the first processor and the second processor to perform the method described in the fourth aspect.

In a sixth aspect, a computer storage medium is provided. The computer storage medium is configured to store programs for testing an adaptor which, when executed, are operable with a first processor and a second processor to perform the method described in the fourth aspect.

DETAILED DESCRIPTION

In order to better understand the features and the technical solutions of implementations, the following will describe in detail implementations in connection with the accompanying drawings. The accompanying drawings are intended for explaining, rather than limiting, the present disclosure.

As mobile terminals (such as a smart phone, a notebook computer, a tablet computer, a personal digital assistant (PDA), a wearable device, and the like) are widely used, the mobile terminals are enjoying increasing popularity among consumers. However, due to high power consumption, the mobile terminal frequently needs to be quickly charged by an adaptor, for example, through VOOC flash charging. The VOOC flash charging is a quick charging technology. Compared with a normal charging technology in which a 5V/1 A power is used, in the VOOC flash charging, the charging speed can be increased for example by at least more than four times. For the VOOC flash charging, the mobile terminal is provided with a specialized adaptor intended for the VOOC flash charging to realize quick charging of the mobile terminal. During the VOOC flash charging, after the adaptor proceeds to a constant-current mode, with increase in battery voltage, an output voltage of the adaptor will increase accordingly. When the output voltage of the adaptor reaches a maximum output voltage of the adaptor, the adaptor proceeds to a constant-voltage mode. When the output voltage of the adaptor is lower than a minimum output voltage of the adaptor, the adaptor proceeds to an undervoltage protection mode, and in the undervoltage protection mode, the adaptor will disconnect output (such as disconnecting or disabling an output path) or enter a restart state.

It can be understood that, to improve the quality of the adaptor, the adaptor needs to be tested before being put on the market. However, in the related art, testing is performed on a single power adaptor and therefore is not comprehensive enough. In addition, if a mobile phone is used as a real workload for test, it is necessary to set a proper test environment, which is inconvenient; on the other hand, a short-circuit test will easily cause mobile phone explosion, which puts testers at risk.

Implementations provide an apparatus for testing an adaptor. In the apparatus for testing an adaptor, a working state of an electronic device is simulated with a testing module and an electronic load. As such, during test of an adaptor, in addition to ensuring test safety of the adaptor, test efficiency can be improved. Hereinafter, implementations will be elaborated in connection with the accompanying drawings.

Figure 1:
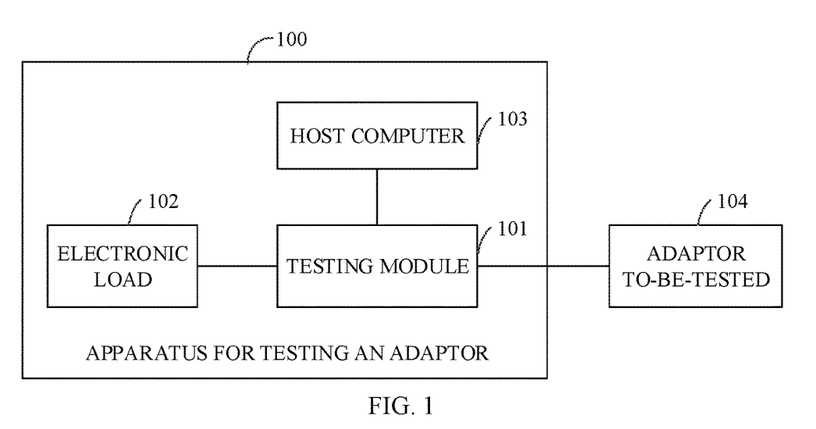
FIG. 1 is a schematic structural diagram of an apparatus for testing an adaptor according to implementations.

FIG. 1 is a schematic structural diagram of an apparatus for testing an adaptor according to some implementations. As illustrated in FIG. 1, the apparatus 100 for testing an adaptor (in the following, "apparatus 100" for short) includes a testing module 101, an electronic load 102, and a host computer 103. The apparatus 100 is configured to be coupled with an adaptor to-be-tested 104 via the testing module 101 to test the adaptor to-be-tested 104.

The testing module 101 is coupled with the electronic load 102 to simulate a working state of an electronic device, to acquire a simulated battery voltage value corresponding to the working state. The testing module 101 is configured to be coupled with the adaptor to-be-tested 104 to control, according to the simulated battery voltage value, the adaptor to-be-tested 104 to be in a target output state. The testing module 101 is coupled with the host computer 103, to detect the target output state of the adaptor to-be-tested 104 to obtain output information of the adaptor to-be-tested 104 and send the output information to the host computer 103. The host computer 103 is configured to output a test result of the adaptor to-be-tested 104 according to the output information of the adaptor to-be-tested 104.

It is to be noted that, the expression "simulated battery" means that a performance state of a real battery of an electronic device is simulated, which is achieved cooperatively by the testing module 101 and the electronic load 102. A voltage value and a current value of the simulated battery should have the same magnitude and phase angle as a voltage value and a current value of the real battery of the electronic device. In other words, the simulated battery is an equivalent circuit of the real battery of the electronic device, which is possible to avoid bodily harm due to explosion of the real battery in fault test.

In addition, the adaptor to-be-tested 104 has a charging function and can charge the electronic device (including a battery). According to the working state of the electronic device, a battery voltage value corresponding to the working state can be acquired. In order to improve the quality of the adaptor to-be-tested 104, it is necessary to test the adaptor to-be-tested 104 with the apparatus 100.

In addition, in the apparatus 100 illustrated in FIG. 1, the electronic load 102 and the host computer 103 may be partially or wholly integrated into the apparatus 100, or the electronic load 102 and the host computer 103 may even be disposed separately without being integrated into the apparatus 100, which is not limited herein.

In some implementations, the electronic load 102 has a voltage regulation function and is configured to operate as follows. The electronic load 102 is configured to receive a load regulation instruction. The electronic load 102 is configured to simulate different working states of the electronic device according to the load regulation instruction and the testing module 101, where working states are in a correspondence relationship with simulated battery voltage values.

In some implementations, the testing module 101 is coupled with the host computer 103. The testing module 101 is further configured to send the simulated battery voltage value to the host computer 103. The host computer 103 is further configured to generate a control instruction according to the simulated battery voltage value and send the control instruction to the testing module 101. The testing module 101 is configured to control, according to the control instruction, the adaptor to-be-tested 104 to be in the target output state.

In some implementations, the testing module 101 is configured to control, according to the control instruction, the adaptor to-be-tested 104 to be in a constant-voltage mode when the simulated battery voltage value is greater than a first preset threshold.

In some implementations, the testing module 101 is configured to control, according to the control instruction, the adaptor to-be-tested 104 to be in an undervoltage protection mode when the simulated battery voltage value is less than a second preset threshold.

In some implementations, the output information of the adaptor to-be-tested 104 includes an output voltage of the adaptor to-be-tested and an output current of the adaptor to-be-tested.

In some implementations, in a constant-voltage mode, the output voltage of the adaptor to-be-tested 104 is maintained in a rated output voltage range, and the output current is decreased when the simulated battery voltage value increases.

In some implementations, in an undervoltage protection mode, the adaptor to-be-tested 104 is controlled to provide no output voltage, or the output voltage is re-provided after no output voltage is provided by the adaptor to-be-tested 104 for a preset duration.

It is to be noted that, the first preset threshold is for indicating that the adaptor to-be-tested 104 is in the constant-voltage mode, for example, the first preset threshold may be 5.5V (volt). The second preset threshold is for indicating that the adaptor to-be-tested 104 is in the undervoltage protection mode, for example, the second preset threshold may be 3V. The preset duration is representative of a reset duration reserved from when the adaptor to-be-tested 104 provides no output voltage to when the adaptor to-be-tested 104 re-provides output voltage, when the adaptor to-be-tested 104 is in the undervoltage protection mode. For example, the preset duration may be 1 s (second). Here, the first preset threshold is different from the second preset threshold, and the first preset threshold is greater than the second preset threshold. The value of the first preset threshold and the value of the second preset threshold depend on a maximum output capacity of the adaptor to-be-tested, which is not limited herein.

In addition, the testing module 101 controls the target output state of the adaptor to-be-tested 104 according to the control instruction, from another perspective, mainly based on the simulated battery voltage value acquired. Different simulated battery voltage values can be acquired by receiving, with the electronic load 102, the load regulation instruction. The control instruction generated by the host computer 103 according to different simulated battery voltage values has different contents. Then the testing module 101 controls, according to the content in the control instruction, the adaptor to-be-tested 104 to be in the target output state.

For example, by regulating the electronic load 102 according to the load regulation instruction, the simulated battery voltage value can be continuously increased. The host computer 103 issues the control instruction according to the simulated battery voltage value currently acquired, where the control instruction includes first instruction content. According to the first instruction content, the testing module 101 can control the output voltage of the adaptor to-be-tested 104 to gradually increase. When the simulated battery voltage value acquired is increased up to be greater than the first preset threshold, for example, when the simulated battery voltage value acquired is greater than 5.5V, the host computer 103 will issue the control instruction according to the simulated battery voltage value currently acquired, where the control instruction includes second instruction content. According to the second instruction content, the testing module 101 can control the adaptor to-be-tested 104 to be in the constant-voltage mode, in other words, the adaptor to-be-tested 104 proceeds to an overvoltage protection process. In this situation, the output voltage of the adaptor to-be-tested 104 is maintained in the rated output voltage range. At the same time, with increase in the simulated battery voltage value, the output current of the adaptor to-be-tested 104 gradually decreases. However, when the simulated battery voltage value acquired is decreased to be less than the second preset threshold, for example, when the simulated battery voltage value acquired is decreased to be less than 3V, the host computer 103 will continue to issue the control instruction according to the simulated battery voltage value currently acquired, where the control instruction includes third instruction content. According to the third instruction content, the testing module 101 can control the adaptor to-be-tested 104 to be in the undervoltage protection mode, in other words, the adaptor to-be-tested 104 proceeds to an undervoltage protection process. In this situation, the adaptor to-be-tested 104 can disconnect output (that is, the adaptor to-be-tested 104 provides no output voltage), or the adaptor to-be-tested 104 can be reset and restarted (that is, after the preset duration in which no output voltage is provided has elapsed (for example, 1 s), the adaptor to-be-tested 104 re-provides output voltage).

In some implementations, the host computer 103 is configured to operate as follows after receiving the output information of the adaptor to-be-tested 104. The host computer 103 is configured to compare the output information of the adaptor to-be-tested 104 with target output information of the adaptor to-be-tested 104. The host computer 103 is configured to output the test result of the adaptor to-be-tested 104 according to the comparison. The target output information of the adaptor to-be-tested 104 is in a correspondence relationship with the target output state of the adaptor to-be-tested 104.

It is to be noted that, while generating the control instruction, the host computer 103 can also acquire the target output information corresponding to the target output state. After acquiring the output information of the adaptor to-be-tested 104, the testing module 101 sends the output information of the adaptor to-be-tested 104 to the host computer 103. Then the host computer 103 compares the output information of the adaptor to-be-tested 104 with the target output information of the adaptor to-be-tested 104, thereby obtaining the test result of the adaptor to-be-tested 104 according to the comparison.

Taking the constant-voltage mode as an example. In one example, the first preset threshold is 5.5V, if the simulated battery voltage value acquired is 5.8V, it can be concluded that the target output state of the adaptor to-be-tested 104 is the constant-voltage mode. That is, the target output information of the adaptor to-be-tested 104 indicates that the output voltage is maintained at 5.5V, and the output current decreases with increase in the simulated battery voltage value. If the output voltage indicated in the output information of the adaptor to-be-tested 104 is 5.5V, and the output current decreases with increase in the simulated battery voltage value, that is, the output information of the adaptor to-be-tested 104 matches the target output information of the adaptor to-be-tested 104, it can be concluded that the test result of the adaptor to-be-tested 104 meets requirements. If the output voltage indicated in the output information of the adaptor to-be-tested 104 is 5.8V, or the output current increases with increase in the simulated battery voltage value, that is, the output information of the adaptor to-be-tested 104 does not match the target output information of the adaptor to-be-tested 104, it can be concluded that the test result of the adaptor to-be-tested 104 does not meet requirements. In this case, it is necessary for the developer to conduct a fault location analysis and quality improvement, to improve the quality of the adaptor to-be-tested.

Figure 2:
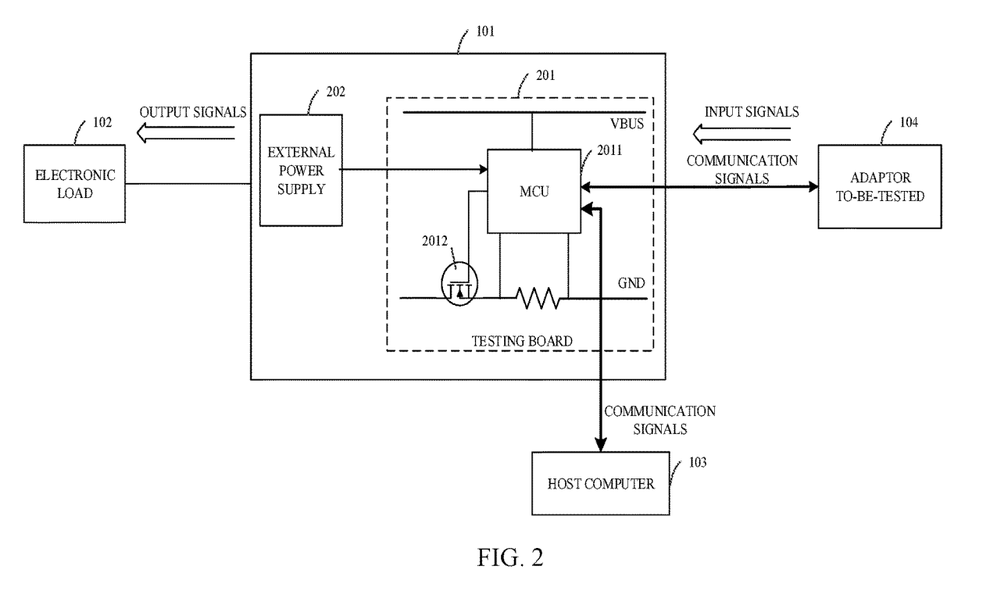
FIG. 2 is a schematic hardware structural diagram of a testing module 101 according to implementations.

FIG. 2 is a schematic hardware structural diagram of the testing module 101 illustrated in FIG. 1 according to implementations. As illustrated in FIG. 2, the testing module 101 includes a testing board 201 and an external power supply 202. The external power supply 202 is configured to supply power to the testing board 201.

In some implementations, the testing board 201 includes at least a metal-oxide-semiconductor field-effect transistor (MOSFET) component 2011 and a microcontroller unit (MCU) component 2012. The testing board 201, along with an electronic load 102, is configured to simulate a working state of an electronic device to test an adaptor to-be-tested 104.

It is to be noted that, the testing module 101 may be an integrated component, unit, or module, and may include more or fewer components than illustrated, may combine some components, or may have a different configuration or arrangement of components. In addition, the testing board 201 may also be an integrated component, unit, or module, and may also include more or fewer components than illustrated, may combine some components, or may have a different configuration or arrangement of components. In terms of power supply of the testing board 201, the external power supply 202 may be provided to supply power externally, or a built-in power supply circuit may be provided in the testing board 201 to supply power internally, which is not limited herein.

For example, as illustrated in FIG. 2, a voltage between VBUS and GND (ground) is in fact the output voltage of the adaptor to-be-tested 104. VBUS and GND need to be respectively coupled with a positive electrode and a negative electrode of a power line of the adaptor to-be-tested 104. Communication between the testing module 101 and the adaptor to-be-tested 104 is actually interchange of communication signals between the MCU component 2012 of the testing board 201 and the adaptor to-be-tested 104. Correspondingly, communication between the testing module 101 and the host computer 103 is actually interchange of communication signals between the MCU component 2012 of the testing board 201 and the host computer 103. The MOSFET component 2011 of the testing board 201 is mainly configured to simulate the working state of the electronic device through cooperation between the testing module 101 and the electronic load 102. By simulating the working state of the electronic device with the testing module and the electronic load, inconvenience of test and risk to testers, which result from using the electronic device directly as a real load to test the adaptor to-be-tested, can be effectively avoided.

As can be seen, in the apparatus for testing an adaptor, the testing module is coupled with the electronic load to simulate the working state of the electronic device and acquire the simulated battery voltage value corresponding to the working state. The testing module is configured to be coupled with the adaptor to-be-tested to control, according to the simulated battery voltage value, the adaptor to-be-tested to be in the target output state. The testing module is coupled with the host computer, to detect the target output state of the adaptor to-be-tested to obtain the output information of the adaptor to-be-tested and send the same to the host computer. The host computer is configured to output the test result of the adaptor to-be-tested according to the output information of the adaptor to-be-tested. Since the working state of the electronic device is simulated with the testing module and the electronic load, inconvenience of test and risk to testers, which result from using the electronic device directly as a load to test the adaptor to-be-tested, can be effectively avoided, such that test safety can be ensured and test efficiency can be improved. At the same time, test of a protection function of the adaptor can improve the quality of the adaptor, thereby improving safety of the adaptor in use.

Figure 3:
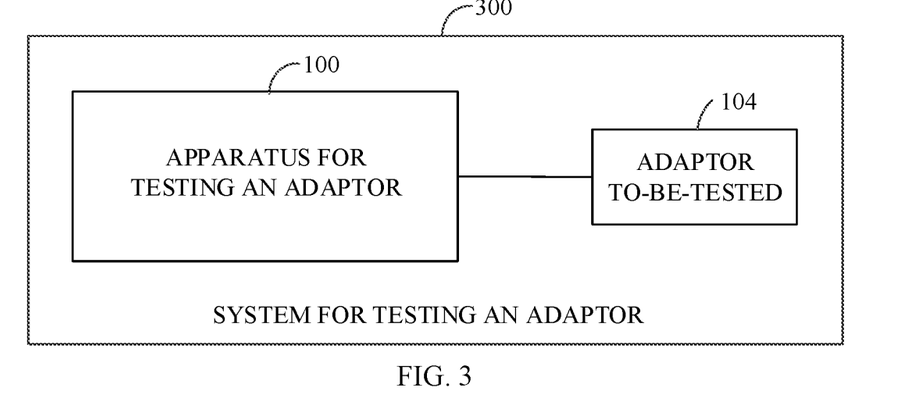
FIG. 3 is a schematic structural diagram of a system for testing an adaptor according to implementations.

FIG. 3 is a schematic structural diagram of a system for testing an adaptor according to some implementations. As illustrated in FIG. 3, the system 300 for testing an adaptor includes an adaptor to-be-tested 104 and an apparatus 100 for testing an adaptor. The apparatus 100 is configured to be coupled with the adaptor to-be-tested 104 to test the adaptor to-be-tested 104, to improve the quality of the adaptor to-be-tested 104. In addition, by using the apparatus 100 according to implementations, test safety can be ensured, and test efficiency can be improved. At the same time, the adaptor is tested in terms of protection functions, such that the quality of the adaptor can be improved, thereby improving safety of the adaptor in use.

Figure 4:
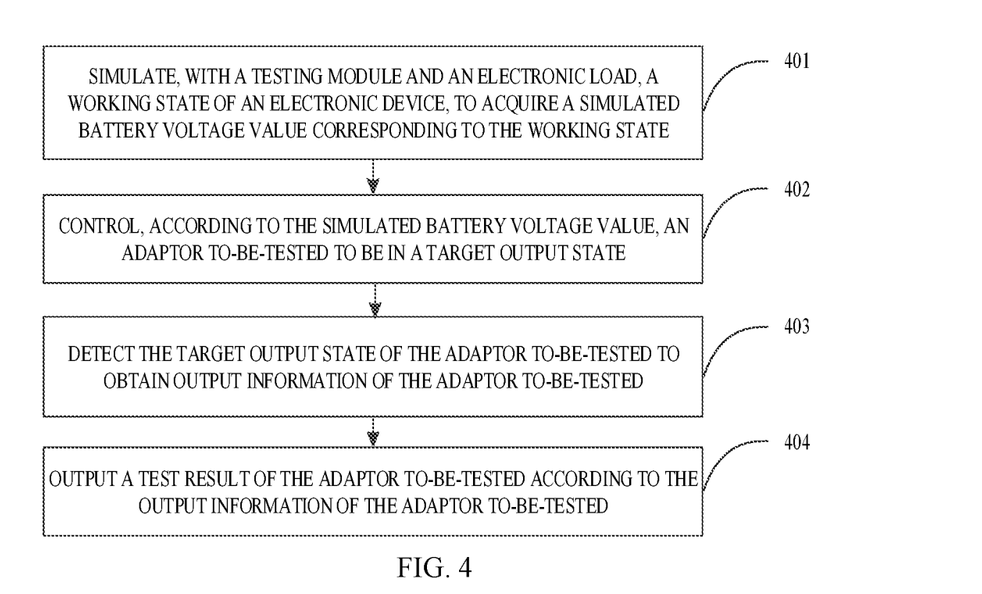
FIG. 4 is a schematic flowchart of a method for testing an adaptor according to implementations.

Based on the same conception as the foregoing implementations, FIG. 4 is a schematic flowchart of a method for testing an adaptor according to implementations. The method is applicable to an apparatus for testing an adaptor. The apparatus includes a testing module, an electronic load, and a host computer. The method begins at block 401.

At block 401, a working state of an electronic device is simulated with the testing module and the electronic load, to acquire a simulated battery voltage value corresponding to the working state.

At block 402, an adaptor to-be-tested is controlled to be in a target output state according to the simulated battery voltage value.

At block 403, the target output state of the adaptor to-be-tested is detected to obtain output information of the adaptor to-be-tested.

At block 404, a test result of the adaptor to-be-tested is outputted according to the output information of the adaptor to-be-tested.

It is to be noted that, the apparatus for testing an adaptor includes the testing module, the electronic load, and the host computer. The electronic load and the host computer may be partially or wholly integrated into the apparatus for testing an adaptor, or the electronic load and the host computer may even be disposed separately without being integrated into the apparatus for testing an adaptor, which is not limited herein.

In addition, the apparatus for testing an adaptor is configured to test the adaptor to-be-tested. The simulated battery voltage value corresponding to the working state of the electronic device is acquired by simulating, by the testing module and the electronic load, the working state, which can effectively avoid inconvenience of test and risk to testers due to use of a real battery in the electronic device directly as a load to test the adaptor to-be-tested, thereby ensuring test safety. The testing module controls, according to the simulated battery voltage value, the adaptor to-be-tested to be in the target output state. The testing module detects the target output state of the adaptor to-be-tested to obtain the output information of the adaptor to-be-tested, and sends the same to the host computer. The host computer outputs the test result of the adaptor to-be-tested. In particular, test of a protection function (such as a constant-voltage mode and an undervoltage protection mode) of the adaptor to-be-tested can achieve improvement of the quality of the adaptor to-be-tested, thereby improving safety of the adaptor to-be-tested in use. During the whole test, the working state of the electronic device is simulated with the testing module and the electronic load, difficulty in test and inconvenience of test, which result from necessity to set a proper test environment when the electronic device is directly used as a load, can be effectively avoided, thereby improving test efficiency.

In some implementations, the working state of the electronic device is simulated with the testing module and the electronic load, to acquire the simulated battery voltage value corresponding to the working state as follows. A load regulation instruction is received with the electronic load. According to the load regulation instruction, a load of the electronic load is regulated. Different working states of the electronic device are simulated by the testing module according to the load of the electronic load, where the electronic load has a voltage regulation function, and working states are in a correspondence relationship with simulated battery voltage values. The simulated battery voltage value corresponding to the working state is acquired according to the working state simulated.

It is to be noted that, the electronic load has a voltage regulation function. The electronic load receives the load regulation instruction. The testing module, according to the load of the electronic load, simulates different working states of the electronic device. Different simulated battery voltage values can be acquired corresponding to different working states. As such, according to implementations, after the adaptor to-be-tested is coupled with the apparatus for testing, the adaptor to-be-tested is tested according to different working states of the electronic device simulated, which can not only ensure comprehensiveness of test of the adaptor and improve the quality of the adaptor but also avoid inconvenience of test and risk to testers which result from using the electronic device directly as a real load to test the adaptor to-be-tested, thereby ensuring test safety and meanwhile improving test efficiency.

In some implementations, the adaptor to-be-tested is controlled to be in the target output state according to the simulated battery voltage value as follows. The testing module sends the simulated battery voltage value to the host computer via connection between the testing module and the host computer. The host computer outputs a control instruction according to the simulated battery voltage value. The adaptor to-be-tested is controlled to be in the target output state according to the control instruction.

It is to be noted that, after acquiring the simulated battery voltage value, the testing module sends the simulated battery voltage value to the host computer. The host computer generates the control instruction according to the simulated battery voltage value, where the control instruction is for instructing the testing module to control the output state of the adaptor to-be-tested. For example, the host computer expects the adaptor to-be-tested to be in the target output state. In this situation, the host computer generates the control instruction and then sends the control instruction to the testing module. The testing module controls, according to the control instruction, the adaptor to-be-tested to be in the target output state.

In some implementations, the adaptor to-be-tested is controlled to be in the target output state according to the control instruction as follows. The adaptor to-be-tested is controlled to be in a constant-voltage mode according to the control instruction when the simulated battery voltage value is greater than a first preset threshold.

In some implementations, the adaptor to-be-tested is controlled to be in the target output state according to the control instruction as follows. The adaptor to-be-tested is controlled to be in an undervoltage protection mode according to the control instruction when the simulated battery voltage value is less than a second preset threshold.

It is to be noted that, the first preset threshold is for indicating that the adaptor to-be-tested is in the constant-voltage mode, for example, the first preset threshold may be 5.5V. The second preset threshold is for indicating that the adaptor to-be-tested is in the undervoltage protection mode, for example, the second preset threshold may be 3V. Here, the first preset threshold is different from the second preset threshold, and the first preset threshold is greater than the second preset threshold. The value of the first preset threshold and the value of the second preset threshold depend on a maximum output capacity of the adaptor to-be-tested, which is not limited herein.

In addition, the testing module controls the target output state of the adaptor to-be-tested according to the control instruction, from another perspective, mainly based on the simulated battery voltage value. Different simulated battery voltage values can be acquired by receiving, with the electronic load, the load regulation instruction. The control instruction generated by the host computer according to different simulated battery voltage values has different contents. Then the testing module controls, according to the content in the control instruction, the adaptor to-be-tested to be in the target output state.

In some implementations, the output information of the adaptor to-be-tested includes an output voltage of the adaptor to-be-tested and an output current of the adaptor to-be-tested.

In some implementations, the adaptor to-be-tested is controlled to be in the target output state according to the control instruction as follows. When the simulated battery voltage value is greater than a first preset threshold, the output voltage is controlled to be maintained in a rated output voltage range according to the control instruction, and the output current is decreased when the simulated battery voltage value increases.

In some implementations, the adaptor to-be-tested is controlled to be in the target output state according to the control instruction as follows. When the simulated battery voltage value is less than a second preset threshold, the adaptor to-be-tested is controlled, according to the control instruction, to disconnect output to provide no output voltage, or the adaptor to-be-tested is controlled, according to the control instruction, to re-provide output voltage after no output voltage is provided by the adaptor to-be-tested for a preset duration.

It is to be noted that, the preset duration is representative of a reset duration reserved from when the adaptor to-be-tested disconnects output to when the adaptor to-be-tested re-provides output, when the adaptor to-be-tested is in the undervoltage protection mode. For example, the preset duration may be 1 s. In addition, the output information of the adaptor to-be-tested is obtained through detection by the testing module. Test of the adaptor to-be-tested is mainly aimed at detecting whether the output voltage and the output current meet preset requirements of the target output state.

For example, for the apparatus for testing an adaptor illustrated in FIG. 1, after the adaptor to-be-tested is coupled with the apparatus for testing an adaptor, assuming that the adaptor to-be-tested is in a charging state to charge the electronic device simulated by the testing module and the electronic load, the adaptor to-be-tested is generally in a constant-current mode first. In this case, by regulating the electronic load, the simulated battery voltage value can be continuously increased. The host computer issues the control instruction according to the simulated battery voltage value currently acquired, where the control instruction includes first instruction content. According to the first instruction content, the testing module can control, the output voltage of the adaptor to-be-tested to gradually increase. When the simulated battery voltage value acquired is increased up to be greater than the first preset threshold, for example, when the simulated battery voltage value acquired is greater than 5.5V, the host computer will also issue the control instruction according to the simulated battery voltage value currently acquired, where the control instruction includes second instruction content. According to the second instruction content, the testing module can control the adaptor to-be-tested to be in the constant-voltage mode, in other words, the adaptor to-be-tested proceeds to an overvoltage protection process. In this situation, the output voltage of the adaptor to-be-tested is maintained in the rated output voltage range. At the same time, with increase in the simulated battery voltage value, the output current of the adaptor to-be-tested gradually decreases. However, when the simulated battery voltage value acquired is decreased to be less than the second preset threshold, for example, when the simulated battery voltage value acquired is decreased to be less than 3V, the host computer will continue to issue the control instruction according to the simulated battery voltage value currently acquired, where the control instruction includes third instruction content. According to the third instruction content, the testing module can control the adaptor to-be-tested to be in the undervoltage protection mode, in other words, the adaptor to-be-tested proceeds to an undervoltage protection process. In this situation, the adaptor to-be-tested disconnects output (that is, the adaptor to-be-tested provides no output voltage), or the adaptor to-be-tested is reset and restarted (that is, after the preset duration in which output voltage is provided has elapsed, for example, 1 s, the adaptor to-be-tested re-provides output voltage). Since the adaptor to-be-tested is tested in terms of overvoltage protection and undervoltage protection, the quality of the adaptor to-be-tested can be improved. In addition, the working state of the electronic device is simulated by the testing module and the electronic load, which can avoid effectively harm of battery explosion caused by overvoltage or undervoltge of the battery, thereby ensuring test safety and improving test efficiency.

In some implementations, the test result of the adaptor to-be-tested is outputted according to the output information of the adaptor to-be-tested as follows. Compare the output information of the adaptor to-be-tested with target output information of the adaptor to-be-tested. The test result of the adaptor to-be-tested is outputted according to the comparison. The target output information of the adaptor to-be-tested is in a correspondence relationship with the target output state of the adaptor to-be-tested.

It is to be noted that, while generating the control instruction, the host computer can also acquire the target output information corresponding to the target output state. After acquiring the output information of the adaptor to-be-tested, the testing module sends the output information of the adaptor to-be-tested to the host computer. Then the host computer compares the output information of the adaptor to-be-tested with the target output information of the adaptor to-be-tested, thereby obtaining the test result of the adaptor to-be-tested according to the comparison.

Taking the constant-voltage mode as an example. In one example, the first preset threshold is 5.5V, if the simulated battery voltage value acquired is 5.8V, it can be concluded that the target output state of the adaptor to-be-tested 104 is the constant-voltage mode. That is, the target output information of the adaptor to-be-tested 104 indicates that the output voltage is maintained at 5.5V, and the output current decreases with increase in the simulated battery voltage value. If the output voltage indicated in the output information of the adaptor to-be-tested 104 is 5.5V, and the output current decreases with increase in the simulated battery voltage value, that is, the output information of the adaptor to-be-tested matches the target output information of the adaptor to-be-tested, it can be concluded that the test result of the adaptor to-be-tested meets requirements. If the output voltage indicated in the output information of the adaptor to-be-tested 104 is 5.8V, or the output current increases with increase in the simulated battery voltage value, that is, the output information of the adaptor to-be-tested does not match the target output information of the adaptor to-be-tested, it can be concluded that the test result of the adaptor to-be-tested does not meet requirements. In this case, it is necessary for the developer to conduct a fault location analysis and quality improvement, to improve the quality of the adaptor to-be-tested.

Implementations provide a method for testing an adaptor. The method is applicable to the apparatus for testing an adaptor. The apparatus includes the testing module, the electronic load, and the host computer. The working state of the electronic device is simulated with the testing module and the electronic load, to acquire the simulated battery voltage value corresponding to the working state. The adaptor to-be-tested is controlled to be in the target output state according to the simulated battery voltage value. The target output state of the adaptor to-be-tested is detected to obtain the output information of the adaptor to-be-tested. The test result of the adaptor to-be-tested is outputted according to the output information of the adaptor to-be-tested. Since the working state of the electronic device is simulated by the testing module and the electronic load, inconvenience of test and risk to testers, which is caused by using the electronic device directly as a load to test the adaptor to-be-tested, can be effectively avoided, thereby ensuring test safety and improving test efficiency. At the same time, test of a protection function of the adaptor can improve the quality of the adaptor, thereby improving safety of the adaptor in use.

It can be understood that, various components or modules described in the technical solution illustrated in FIG. 0.1 may be integrated into one processing unit or may be present as a number of physically separated units, and two or more units may be integrated into one. The integrated unit may be implemented in the form of hardware or as a software functional unit.

If the integrated units are implemented as software functional units and sold or used as standalone products, they may be stored in a computer readable storage medium. Based on such an understanding, the essential technical solution, or the portion that contributes to the prior art, or all or part of the technical solution of the disclosure may be embodied as software products. The computer software products can be stored in a storage medium and may include multiple instructions that, when executed, can cause a computing device, e.g., a personal computer, a server, a network device, etc., to execute some or all operations of the methods described in various implementations. The above storage medium may include various kinds of media that can store program codes, such as a universal serial bus (USB) flash disk, a mobile hard drive, a read-only memory (ROM), a random access memory (RAM), a magnetic disk, or an optical disk.

Therefore, implementations provide a computer storage medium. The computer storage medium is configured to store programs for testing an adaptor which, when executed, are operable with at least one processor to perform the method described in technical solution illustrated in FIG. 4.

Figure 5:
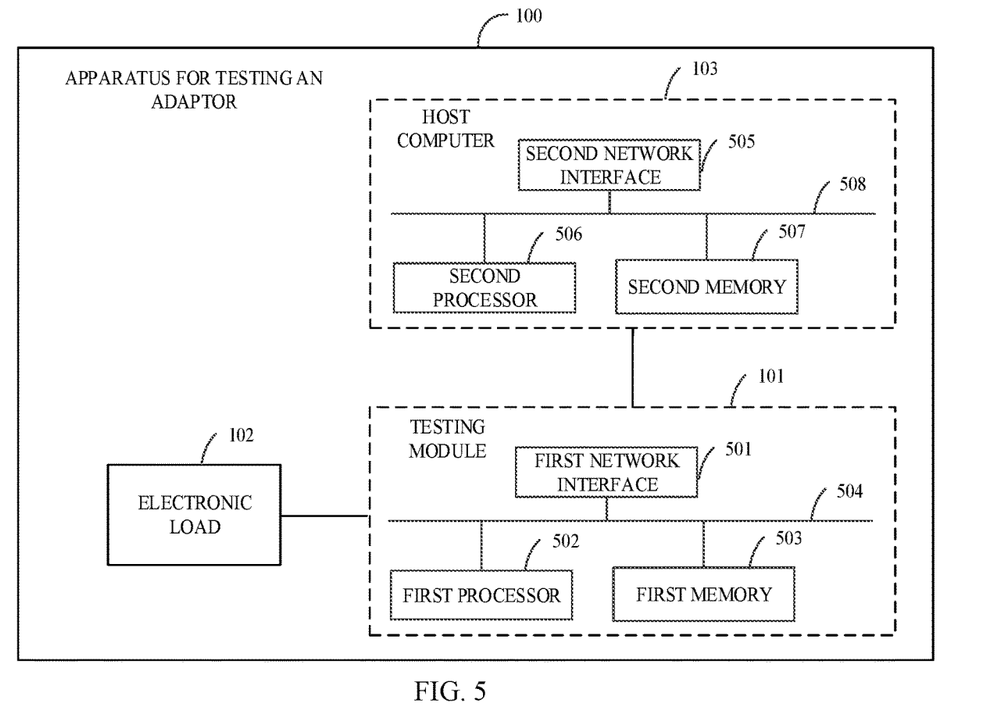
FIG. 5 is a schematic structural diagram of an apparatus for testing an adaptor according to implementations.

Based on the apparatus 100 for testing an adaptor and the computer storage medium, FIG. 5 is a schematic structural diagram of an apparatus 100 for testing an adaptor according to implementations. A testing module 101 includes a first network interface 501, a first processor 502, and a first memory 503 configured to store computer programs operable with the first processor 502. The first network interface 501, the first processor 502, and the first memory 503 are coupled together via a first bus system 504. A host computer 103 includes a second network interface 505, a second processor 506, and a second memory 507 configured to store computer programs operable with the second processor 506. The second network interface 505, the second processor 506, and the second memory 507 are coupled together via a second bus system 508.

In addition, the computer programs, when executed, are operable with the first processor 502 to: simulate, with the testing module and the electronic load, a working state of an electronic device, to acquire a simulated battery voltage value corresponding to the working state; control, according to the simulated battery voltage value, an adaptor to-be-tested to be in a target output state; detect the target output state of the adaptor to-be-tested to obtain output information of the adaptor to-be-tested. The computer programs, when executed, are operable with the second processor 506 to: output a test result of the adaptor to-be-tested according to the output information of the adaptor to-be-tested.

It can be understood that, the first memory 503 according to implementations may be a volatile memory or a non-volatile memory, or may include both the volatile memory and the non-volatile memory. The non-volatile memory may be a ROM, a programmable read only memory (programmable ROM, PROM), an erasable programmable read only memory (Erasable PROM, EPROM), an electrically erasable programmable read only memory (Electrically EPROM, EEPROM), or flash memory. The volatile memory can be a RAM that acts as an external cache. By way of example but not limitation, many forms of RAM are available, such as a static random access memory (static RAM, SRAM), a dynamic random access memory (dynamic RAM, DRAM), a synchronous dynamic random access memory (synchronous DRAM, SDRAM), a double data rate SDRAM (DDRSDRAM), an enhanced synchronous dynamic random access memory (ESDRAM), a synchronous connection dynamic random access memory (synchlink DRAM, SLDRAM), and a direct rambus random access memory (direct rambus RAM, DRRAM). The first memory 503 of the systems and methods described herein is intended to include, but is not limited to, these and any other suitable types of memory.

The first processor 502 may be an integrated circuit chip with signal processing capabilities. During implementation, each step of the foregoing method may be completed by an integrated logic circuit of hardware in the first processor 502 or an instruction in the form of software. The first processor 502 may be a general-purpose processor, a digital signal processor (DSP), an application specific integrated circuit (ASIC), a field programmable gate array (FPGA), or other programmable logic devices, discrete gates or transistor logic devices, discrete hardware components. The methods, steps, and logic blocks disclosed in implementations can be implemented or executed. The general purpose processor may be a microprocessor, or the processor may be any conventional processor or the like. The steps of the method disclosed in implementations may be directly implemented as a hardware decoding processor, or may be performed by hardware and software modules in the decoding processor. The software module can be located in a storage medium such as a RAM, a flash memory, a ROM, a PROM, or an electrically erasable programmable memory, registers, and the like. The storage medium is located in the first memory 503. The first processor 502 reads the information in the first memory 503, and completes the steps of the method described above with the hardware thereof.

It can be understood that, in terms of hardware function, the second memory 507 is similar to the first memory 503, and the second processor 506 is similar to the first processor 502, which will not be repeated herein.

It will be appreciated that implementations described herein can be implemented in one or more of hardware, software, firmware, middleware, and microcode. For hardware implementation, the processing unit can be implemented in one or more ASICs, DSPs, DSP devices (DSPD), programmable logic devices (PLD), FPGAs, general purpose processors, controllers, microcontrollers, microprocessors, other electronic units for performing the functions described herein or a combination thereof.

For a software implementation, the technology described herein can be implemented by modules (e.g., procedures, functions, and so on) for performing the functions described herein. The software code can be stored in the memory and executed by the processor. The memory can be implemented in the processor or external to the processor.

As other implementations, the computer programs, when executed, are operable with the first processor 502 and the second processor 506 to perform the method illustrated in FIG. 4, which will not be repeated herein.

It is to be noted that, technical solutions described in various implementations can be combined with each other without conflict.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

INDUSTRIAL APPLICABILITY

According to implementations, the apparatus for testing an adaptor includes the testing module, the host computer, and the electronic load. The simulated battery voltage value corresponding to the working state of the electronic device is acquired by simulating, by the testing module and the electronic load, the working state, which can effectively avoid inconvenience of test and risk to testers due to use of a real battery in the electronic device directly as a load to test the adaptor to-be-tested, thereby ensuring test safety. The testing module controls, according to the simulated battery voltage value, the adaptor to-be-tested to be in the target output state. The testing module detects the target output state of the adaptor to-be-tested to obtain the output information of the adaptor to-be-tested, and sends the output information to the host computer. The host computer outputs the test result of the adaptor to-be-tested. In particular, the adaptor to-be-tested is tested in terms of protection functions (such as the constant-voltage mode and the undervoltage protection mode). As such, the quality of the adaptor to-be-tested can be improved, thereby improving safety of the adaptor to-be-tested in use. During the whole test, the working state of the electronic device is simulated with the testing module and the electronic load, difficulty in test and inconvenience of test, which result from necessity to set a proper test environment when the electronic device is directly used as a load, can be effectively avoided, thereby improving test efficiency.

What is claimed is:

1. An apparatus for testing an adaptor, comprising a testing module, a host computer, and an electronic load;
   the testing module being coupled with the electronic load to simulate a working state of an electronic device, to acquire a simulated battery voltage value corresponding to the working state;
   the testing module being configured to be coupled with an adaptor to-be-tested to control, according to the simulated battery voltage value, the adaptor to-be-tested to be in a target output state;
   the testing module being coupled with the host computer to detect the target output state of the adaptor to-be-tested, to obtain output information of the adaptor to-be-tested and send the output information to the host computer; and
   the host computer being configured to output a test result of the adaptor to-be-tested according to the output information of the adaptor to-be-tested.

2. The apparatus of claim 1, wherein the electronic load has a voltage regulation function and is configured to:
   receive a load regulation instruction; and
   regulate a load of the electronic load according to the load regulation instruction; and wherein
   the testing module is configured to simulates different working states of the electronic device according to the load of the electronic load, and working states are in a correspondence relationship with simulated battery voltage values.

3. The apparatus of claim 1, wherein
   the testing module is further configured to send the simulated battery voltage value to the host computer;

the host computer is further configured to generate a control instruction according to the simulated battery voltage value and send the control instruction to the testing module; and the testing module is configured to control, according to the control instruction, the adaptor to-be-tested to be in the target output state, wherein the target output state comprises a constant-voltage mode and an undervoltage protection mode.

4. The apparatus of claim 3, wherein the testing module is configured to control, according to the control instruction, the adaptor to-be-tested to be in the constant-voltage mode when the simulated battery voltage value is greater than a first preset threshold.

5. The apparatus of claim 3, wherein the testing module is configured to control, according to the control instruction, the adaptor to-be-tested to be in the undervoltage protection mode when the simulated battery voltage value is less than a second preset threshold.

6. The apparatus of claim 1, wherein the output information of the adaptor to-be-tested comprises an output voltage of the adaptor to-be-tested and an output current of the adaptor to-be-tested, wherein the target output state comprises a constant-voltage mode and an undervoltage protection mode.

7. The apparatus of claim 6, wherein in the constant-voltage mode, the output voltage of the adaptor to-be-tested is maintained in a rated output voltage range, and the output current decreases with increase of the simulated battery voltage value.

8. The apparatus of claim 6, wherein in the undervoltage protection mode, the adaptor to-be-tested is controlled to provide no output voltage, or the output voltage is re-provided after no output voltage is provided by the adaptor to-be-tested for a preset duration.

9. The apparatus of claim 1, wherein the host computer is configured to:
compare the output information of the adaptor to-be-tested with target output information of the adaptor to-be-tested; and
output the test result of the adaptor to-be-tested according to the comparison, wherein the target output information of the adaptor to-be-tested is in a correspondence relationship with the target output state of the adaptor to-be-tested.

10. The apparatus of claim 1, wherein the testing module comprises a testing board and a power supply, and the power supply is configured to supply power to the testing board.

11. A method for testing an adaptor, performed in an apparatus for testing an adaptor, the apparatus comprising a testing module, an electronic load, and a host computer, and the method comprising:
simulating, with the testing module and the electronic load, a working state of an electronic device, to acquire a simulated battery voltage value corresponding to the working state;
controlling, according to the simulated battery voltage value, an adaptor to-be-tested to be in a target output state;
detecting the target output state of the adaptor to-be-tested to obtain output information of the adaptor to-be-tested; and
outputting a test result of the adaptor to-be-tested according to the output information of the adaptor to-be-tested.

12. The method of claim 11, wherein simulating, with the testing module and the electronic load, the working state of the electronic device, to acquire the simulated battery voltage value corresponding to the working state comprises:
receiving, with the electronic load, a load regulation instruction;
regulating, with the electronic load, a load of the electronic load according to the load regulation instruction;
simulating, with the testing module, different working states of the electronic device according to the load of the electronic load, wherein the electronic load has a voltage regulation function, and working states are in a correspondence relationship with simulated battery voltage values; and
acquiring, according to the working state simulated, the simulated battery voltage value corresponding to the working state.

13. The method of claim 11, wherein controlling, according to the simulated battery voltage value, the adaptor to-be-tested to be in the target output state comprises:
sending, by the testing module, the simulated battery voltage value to the host computer via connection between the testing module and the host computer;
outputting, by the host computer, a control instruction according to the simulated battery voltage value; and
controlling, according to the control instruction, the adaptor to-be-tested to be in the target output state, wherein the target output state comprises a constant-voltage mode and an undervoltage protection mode.

14. The method of claim 13, wherein controlling, according to the control instruction, the adaptor to-be-tested to be in the target output state comprises:
controlling, according to the control instruction, the adaptor to-be-tested to be in the constant-voltage mode when the simulated battery voltage value is greater than a first preset threshold.

15. The method of claim 13, wherein controlling, according to the control instruction, the adaptor to-be-tested to be in the target output state comprises:
controlling, according to the control instruction, the adaptor to-be-tested to be in the undervoltage protection mode when the simulated battery voltage value is less than a second preset threshold.

16. The method of claim 11, wherein the output information of the adaptor to-be-tested comprises an output voltage of the adaptor to-be-tested and an output current of the adaptor to-be-tested.

17. The method of claim 16, wherein controlling, according to the control instruction, the adaptor to-be-tested to be in the target output state comprises:
when the simulated battery voltage value is greater than a first preset threshold,
controlling, according to the control instruction, the output voltage to be maintained in a rated output voltage range, and decreasing the output current when the simulated battery voltage value increases.

18. The method of claim 16, wherein controlling, according to the control instruction, the adaptor to-be-tested to be in the target output state comprises one of:
when the simulated battery voltage value is less than a second preset threshold,
controlling, according to the control instruction, the adaptor to-be-tested to provide no output voltage; and
controlling, according to the control instruction, the adaptor to-be-tested to re-provide output voltage after no output voltage is provided by the adaptor to-be-tested for a preset duration.

19. The method of claim 11, wherein outputting the test result of the adaptor to-be-tested according to the output information of the adaptor to-be-tested comprises:
    comparing the output information of the adaptor to-be-tested with target output information of the adaptor to-be-tested; and
    outputting the test result of the adaptor to-be-tested according to the comparison, wherein the target output information of the adaptor to-be-tested is in a correspondence relationship with the target output state of the adaptor to-be-tested.

\* \* \* \* \*